United States Patent [19]

Oritani

[11] Patent Number: 4,467,456
[45] Date of Patent: Aug. 21, 1984

[54] MEMORY CIRCUIT

[75] Inventor: Atsushi Oritani, Yokohama, Japan

[73] Assignee: Fujitsu Limited, Kawasaki, Japan

[21] Appl. No.: 353,332

[22] Filed: Mar. 1, 1982

[30] Foreign Application Priority Data

Mar. 9, 1981 [JP] Japan .................................. 56-33475

[51] Int. Cl.³ .............................................. G11C 7/00
[52] U.S. Cl. ..................................... 365/190; 365/203
[58] Field of Search ............... 365/154, 156, 190, 202, 365/203, 204, 207

[56] References Cited

U.S. PATENT DOCUMENTS 4,348,747 9/1982 Takahashi ....................... 365/190 X
4,379,344 4/1983 Ozawa et al. ......................... 365/203

Primary Examiner—Joseph A. Popek
Attorney, Agent, or Firm—Staas & Halsey

[57] ABSTRACT

A high density static RAM integrated circuit including a pair of bit lines to which pull-up loads are respectively connected, a plurality of memory cells which are connected across the pair of bit lines, a pair of data buses which are connected to the pair of bit lines, and a sense amplifier which is connected to the pair of bit lines through the pair of data buses, the pair of data buses being respectively provided with charging circuits each of which has a control terminal for varying a pull-up current, amplified outputs of the sense amplifier being fed back to the control terminals of the charging circuits, the data bus on a high potential side being charged by the corresponding charging circuit. As a result, the current which flows across a common data bus line connected to a higher side of the selected bit lines is increased, thereby enabling a high speed read out operation in the high density static RAM.

8 Claims, 4 Drawing Figures

MEMORY CIRCUIT

BACKGROUND OF THE INVENTION

The present invention relates to a static RAM (random access memory) integrated circuit of high memory density. More particularly, it relates to a fast-access RAM which, in reading out stored data from a memory cell, changes a data bus line load in correspondence with the data to be read out, thereby realizing fast readout.

When it is intended to make the memory density of a static RAM high, the size of each cell for storing data becomes small. Since the cell of the ordinary static RAM is constructed of a flip-flop circuit, the small cell size results in lowering the transconductances $g_m$ of MIS field effect transistors (hereinbelow, termed "MOS FETs") for a cell driver. In order to attain the function of the memory cell satisfactorily (that is, to cause the transistor on the "ON" side of the cell to pull down the corresponding bit line), current which flows through a load for pulling up the bit line must be reduced. By way of example, when a MOS FET is used as the load, its transconductance $g_m$ must be made small. This causes degradation in the charging ability of the bit line, that is, lowering in the changing rate thereof from a low level to a high level, so that the rise of the potential of the bit line becomes slow. Under such a condition, it is difficult to make the operation of the high-density static RAM fast.

SUMMARY OF THE INVENTION

An object of the present invention is to provide a high-density static RAM capable of fast operation.

In order to accomplish the above object, according to the present invention, current which flows through the load of a data bus line (which may be regarded as being equivalent to a bit line in points of potential changes etc. because it is connected to the bit line through a column selecting gate), e.g., a pull-up FET, in other words, a charging current is changed in accordance with a signal read out of one of the memory cells.

The memory circuit according to the present invention comprises: a pair of bit lines to which pull-up loads are respectively connected; a plurality of memory cells connected to said pair of bit lines; a pair of data bus lines operatively connected to said pair of bit lines; a sense amplifier which is connected to said pair of bit lines through said pair of data bus lines; and a charging circuit operatively connected to said pair of data bus lines for charging up one of said pair of data bus lines whose potential is higher than the other one of said pair of data bus lines, said charging circuit having a terminal for receiving an output from said sense amplifier and being activated by said output.

BRIEF DESCRIPTION OF THE DRAWINGS

FIG. 3B is a waveform diagram of signals in the embodiment of the present invention.

DESCRIPTION OF THE PREFERRED EMBODIMENT

Hereunder, the present invention will be described in detail in conjunction with an illustrated embodiment.

Figure 1:
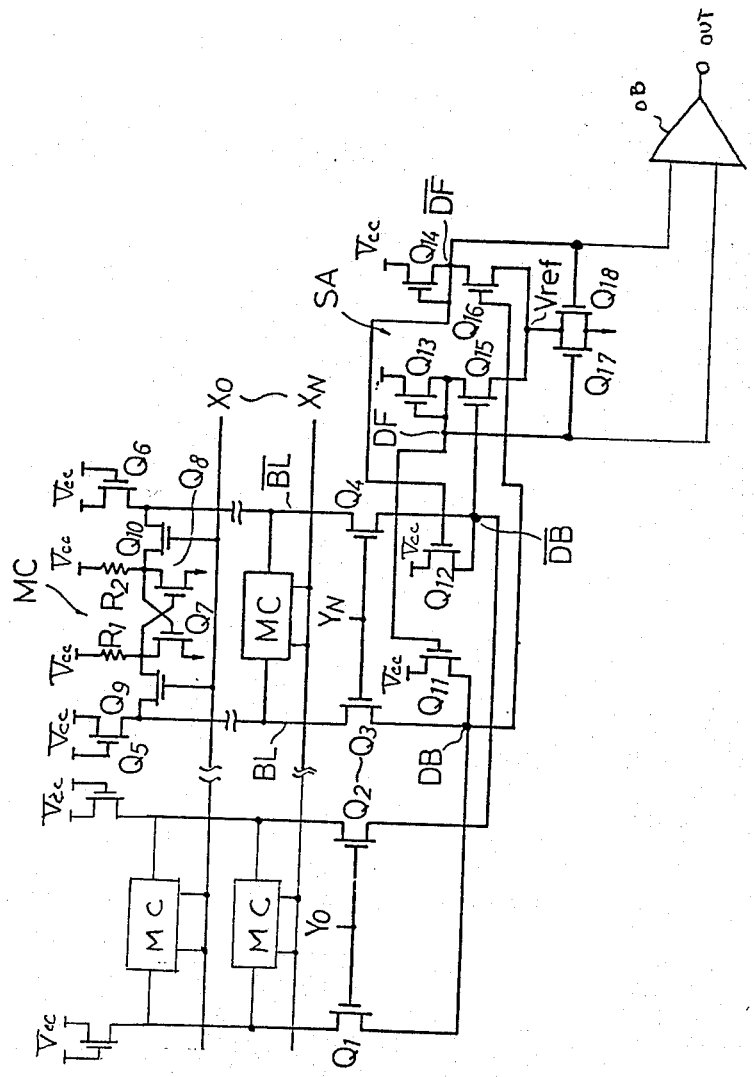
FIG. 1 is a circuit diagram showing an embodiment of the present invention.

FIG. 1 shows one embodiment of the present invention. MC indicates a memory cell, and SA a sense amplifier. $X_0$–$X_N$ indicate word lines, and $Y_0$–$Y_N$ column selecting signal lines. $Q_1$–$Q_4$ denotes MOS FETs for column selecting gates, and $Q_5$ and $Q_6$ MIS FETs (hereinafter, MOS FETs) as bit line loads. MOS FETs $Q_7$ and $Q_8$ constitute a cell driver, and are respectively provided with load elements (resistors) $R_1$ and $R_2$. MOS FETs $Q_9$ and $Q_{10}$ function as transfer gates. BL and $\overline{BL}$ designate a pair of bit lines, and DB and $\overline{DB}$ a pair of data bus lines. MOS FETs $Q_{11}$ and $Q_{12}$ form charging circuits for the data bus lines DB and $\overline{DB}$, respectively. The sense amplifier SA is a differential amplifier in which two inverters include depletion-mode load MOS FETs $Q_{13}$ and $Q_{14}$ and enhancement-mode driving MOS FETs $Q_{15}$ and $Q_{16}$ having sources connected in common. In addition, MOS FETs $Q_{17}$ and $Q_{18}$ are connected to the common source in parallel with each other. Outputs DF and $\overline{DF}$ are fed back to the MOS FETs $Q_{17}$ and $Q_{18}$, to correct a reference voltage $V_{ref}$ into an appropriate value at all times so as to effect a linear operation. The input of the sense amplifier SA on the side of the MOS FET $Q_{15}$ is the potential of the data bus line $\overline{DB}$, while the input thereof on the side of the MOS FET $Q_{16}$ is the potential of the data bus line DB. The amplified output DF identical in polarity to the potential of the data bus line DB is obtained from the drain side of the MOS FET $Q_{15}$, and is fed back to the gate of the MOS FET $Q_{11}$. On the other hand, the amplified output $\overline{DF}$ identical in polarity to the potential of the data bus line $\overline{DB}$ is obtained from the drain side of the MOS FET $Q_{16}$, and it is fed back to the gate of the MOS FET $Q_{12}$. Symbol $V_{cc}$ signifies a power source, and a downward arrow signifies grounding.

Figure 2:
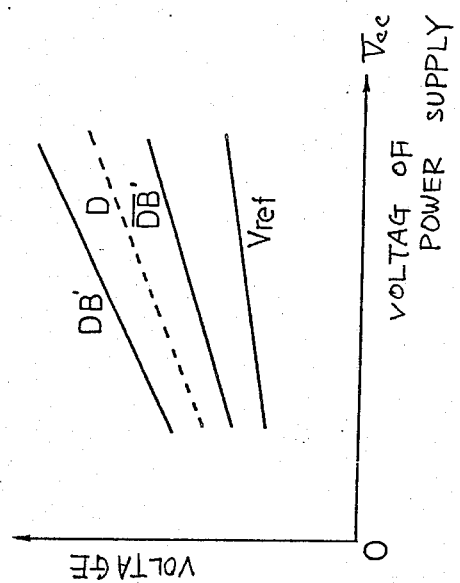
FIG. 2 is a graph showing the characteristic curves of signal voltages versus the supply voltage.

In the sense amplifier SA, the outputs DF and $\overline{DF}$ are respectively fed back to the gates of the MOS FETs $Q_{17}$ and $Q_{18}$. Therefore, the reference voltage $V_{ref}$ is virtually grounded or becomes a constant voltage with respect to the inputs DB and $\overline{DB}$. In addition, the reference voltage $V_{ref}$ is in-phase with the supply voltage. That is, the reference voltage $V_{ref}$ rises as the supply voltage becomes higher, and the former lowers as the latter becomes lower. When the input signal $\overline{DB}$ (here, a signal shall be indicated by the same symbol as that of the corresponding line) of the MOS FET $Q_{15}$ has changed to the high level ("H") (increased) and the input signal DB of the MOS FET $Q_{16}$ has changed to the low level ("L") (decreased), the output potential DF lowers and the output potential $\overline{DF}$ rises. Upon receiving these outputs, the MOS FET $Q_{17}$ lowers its degree of conduction, and the MOS FET $Q_{18}$ raises the same. The combined resistance of the parallel circuit comprising transistors $Q_{17}$ and $Q_{18}$ is substantially invariable. Accordingly, the reference voltage $V_{ref}$ remains constant. In contrast, when both the input voltages of the MOS FETs $Q_{15}$ and $Q_{16}$ have increased, both the degrees of conduction of the transistors $Q_{17}$ and $Q_{18}$ lower, so that the reference voltage $V_{ref}$ rises. In addition, when both the input voltages of the MOS FETs $Q_{15}$ and $Q_{16}$ have decreased, both the degrees of conduction of the transistors $Q_{17}$ and $Q_{18}$ rise, so that the reference voltage $V_{ref}$ lowers. As a result, the voltages DB, $\overline{DB}$ and $V_{ref}$ change as shown in FIG. 2. In the figure, the axis of the abscissa represents the supply voltage $V_{cc}$ which causes the in-phase variations of the data bus line potentials, while the axis of the ordinate represents voltages DB' and $\overline{DB}'$ and the reference voltage $V_{ref}$. The voltage DB' is the voltage of the data bus DB at the high level thereof, while the voltage $\overline{DB}'$ is the voltage of the data bus $\overline{DB}$ at the low level thereof. In order for the sense amplifier SA to execute a linear operation, a value obtained by adding the reference voltage $V_{ref}$ and the source-drain voltage of each MOS FET $Q_{15}$ or $Q_{16}$ needs to lie between the voltages DB' and $\overline{DB}'$. As is apparent from FIG. 2, the aforementioned value of the sense amplifier SA shown in FIG. 1 corresponds to a dotted line D in FIG. 2. Therefore, the MOS FETs $Q_{15}$ and $Q_{16}$ constituting the differential amplifier execute the linear operation.

Accordingly, when the potentials of the inputs DB and $\overline{DB}$ fluctuate even slightly, this amplifier generates the amplified outputs DF and $\overline{DF}$ following the fluctuations. That is, the amplifier operates as an analog linear amplifier in which when the input DB changes from "L" (low level) to "H" (high level) and the input $\overline{DB}$ from "H" to "L", the output $\overline{DF}$ rapidly shifts from "H" to "L" and the output DF from "L" to "H". In addition, the outputs DF and $\overline{DF}$ are respectively fed back to the gates of the MOS FETs $Q_{11}$ and $Q_{12}$ with the same polarity. Then, the potential changes of the data bus line and the bit line shifting from "L" to "H", e.g., DB and BL are promoted by the charging due to the MOS FET $Q_{11}$ and are therefore effected quickly. This is equivalent to the fact that the transconductance $g_m$ of the bit line load transistor $Q_5$ increases temporarily during the charging. On the other hand, regarding the potential changes of the data bus line and the bit line $\overline{DB}$ and $\overline{BL}$ shifting from "H" to "L", the MOS FET $Q_{12}$ has its gate supplied with the amplified output DB changing from "H" to "L" and turns "off". Therefore, the discharging characteristics of the data bus line and bit line are not different from those based on only the bit line load MOS FET $Q_6$. Since the transconductance $g_m$ of the MOS FET $Q_6$ remains low, the pull-down of the data bus line and bit line is satisfactorily effected by the cell driver MOS FET $Q_8$.

In FIG. 1, OB is an output buffer which recives the signals DF and $\overline{DF}$ and outputs a read out signal to an output terminal OUT.

Figure 3A:
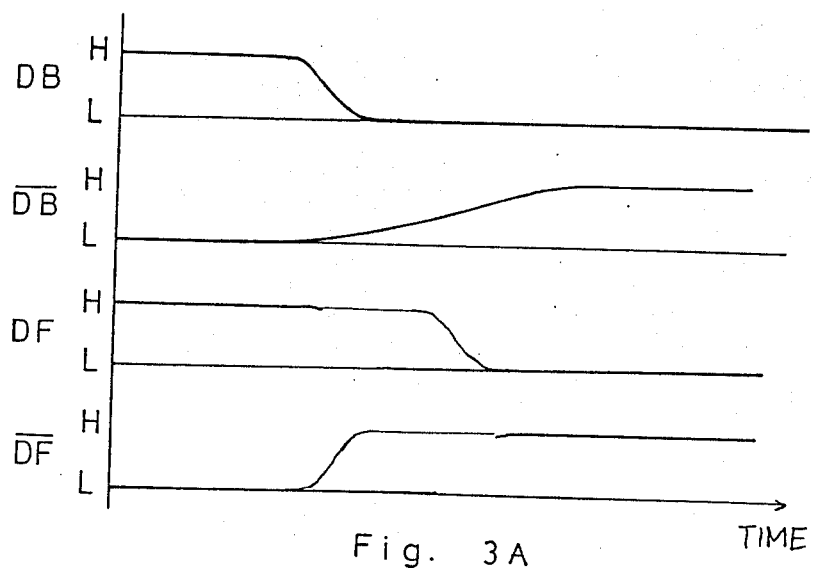
FIG. 3A and 3B are waveform diagrams of signals in a conventional circuit.
Figure 3B:
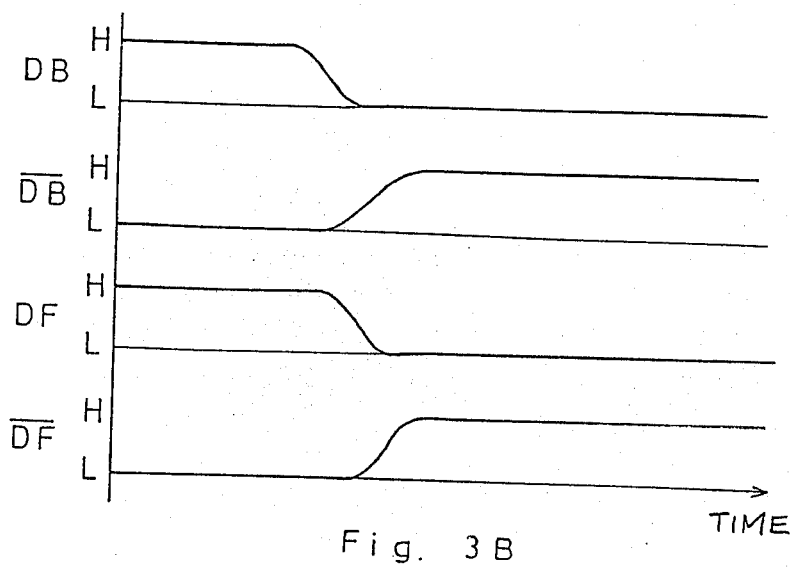

FIGS. 3A and 3B are signal waveform diagrams showing the variations of data bus line signals DB and $\overline{DB}$, and output signals DF, $\overline{DF}$ in a conventional circuit and the embodiment of the present invention, respectively. The conventional circuit doesn't comprise the charging transistors $Q_{11}$ and $Q_{12}$ in FIG. 1. In the conventional circuit's signal waveform illustrated in FIG. 3A, when data to be read out changes from "H" to "L", the signal DB changes from "H" to "L" rapidly, but the signal $\overline{DB}$ changes from "L" to "H" slowly.

This is the reason that the discharging ability of transistor $Q_7$ ($Q_8$) is better than the charging ability of transistor $Q_6$ ($Q_5$) generally. The slow change is attributed to a small charging current, and results in delaying the change of the output DF from "H" to "L". In the embodiment of the present invention illustrated in FIG. 3B, the signal DB changes from "H" to "L" rapidly, and the charging current is consequently increased, so that the rise of the signal $\overline{DB}$ is fast. Also the signal DF falls faster than in the conventional circuit. Although FIG. 3B refers to the case where the data to be read out changes from "H" to "L", changes from "L" to "H" or the rises of the signals DB and DF quicken in the converse case where the data to be read out changes from "L" to "H".

As described above, in the memory of the present invention, in accordance with the read-out result, the charging MOS FET connected to the data bus line on the "H" side turns "on" and performs the pull-up operation, but the charging MOS FET connected to the data bus line on the "L" side turns "off" and contributes nothing. The next selection of a cell under this state will now be considered. It is supposed that the selected cell belongs to the same column as and a different word line from those of the preceding cell and that it stores data opposite to the data of the preceding cell. Then, the "ON" MOS FET of the selected cell pulls down the bit line and the data bus line on the "H" side (BL and DB in the present embodiment). In this regard, since the MOS FET $Q_{11}$ is included, the pull-down load becomes greater than in the conventional. However, the presence of the MOS FET $Q_{11}$ forms no special obstacle for reasons described hereunder. Unlike the nonlinear type sense amplifier of the conventional memory which does not operate unless a potential difference on the order of ±0.5 V arises, the sense amplifier SA of the memory of the present invention is a linear amplifier which has the widest possible range of proportional operation as described before. Therefore, as soon as the bit line and data bus line begin to change their potential levels, the sense amplifier SA starts operating so as to promote the changes. Moreover, originally the memory cell of the specified type has the transconductance $g_m$ ratio between the driver MOS FETs $Q_7$ and $Q_8$ and the transfer gate MOS FETs $Q_9$ and $Q_{10}$ selected properly, so that the bit line and the data bus line close to the power source as viewed from the minute or small memory cell can be sufficiently pulled down. After all, according to the present invention, the transconductance $g_m$ of the data bus load is equivalently made high during the charging and low (as usual) during the discharging, so that the transconductance $g_m$ of the bit line load can be set in a ratioless form relative to the transconductance $g_m$ of the cell driver. Accordingly, the signal change of the bit line is efficiently rendered fast, and the read-out speed is enhanced. By the way, read-out outputs are derived by passing the outputs DF and $\overline{DF}$ of the sense amplifier SA through the output buffer OB.

While, in the embodiment of the present invention, the MOS FETs $Q_5$ and $Q_6$ have been used as the loads, they can be replaced with resistors. Further, while the MOS FETs have been referred to in the description, other semiconductor devices are also usable.

As set forth above, according to the present invention, a bit line load current, in other words, a charging current which is lower because of a high memory density of a memory is changed in response to a signal to be read out, so that fast read-out is permitted even when the transconductance $g_m$ of a cell driver is low.

I claim:
1. A memory circuit, comprising:
a pair of pull-up loads;
a pair of bit lines to which said pull-up loads are respectively connected;
a plurality of memory cells operatively connected to said pair of bit lines;
a pair of data bus lines operatively connected to said pair of bit lines;
a sense amplifier operatively connected to said pair of bit lines through said pair of data bus lines and having output terminals for producing an output; and a charging circuit, operatively connected to said pair of data bus lines and the output terminals of said sense amplifier, for charging up the one of said pair of data bus lines whose potential is higher that that of the other one of said pair of data bus lines, said charging circuit having terminals for receiving the output of the output terminals of said sense amplifier and being activated by said output.

2. A memory circuit according to claim 1, wherein said sense amplifier comprises a linear amplifier which has reciprocal output terminals.

3. A memory circuit according to claim 2,
wherein one of said data bus lines is a positive-phase data bus line and the other of said data bus lines is a negative-phase data bus line,
wherein said sense amplifier produces positive and negative phase outputs at the output terminals, and
wherein said charging circuit comprises first and second field effect transistors each having a drain connected to a power source, a source connected to a corresponding one of the positive-phase and negative-phase data bus lines and a gate supplied with a corresponding one of the positive-phase and negative-phase outputs of said sense amplifier.

4. A memory circuit according to claim 1, further comprising a word line, and wherein each said memory cell comprises: first through fourth field effect transistors each having a gate, drain and source; and first and second load elements, said first and second field effect transistors have their sources grounded and have their drains respectively connected to a power source through said first and second load elements, the gate of said first field effect transistor and the drain of said third field effect transistor are connected to the drain of said second field effect transistor, the gate of said second field effect transistor and the drain of said fourth field effect transistor are connected to the drain of said first field effect transistor, and said third and fourth field effect transistors have their gates connected to the word line of said memory circuit corresponding to said memory cell and have their sources connected to the corresponding bit lines.

5. A memory circuit according to claim 1, further comprising gate circuits operatively connected between said pair of bit lines and said pair of data bus lines, respectively, and said gate circuits having a switching function.

6. A memory circuit according to claim 1, wherein each said pull-up load comprises an MIS field effect transistor, operatively connected to the respective bit line, having a gate and a drain both connected to a power source.

7. A memory circuit, comprising:
a memory cell array arranged in columns;
gate means, operatively connected to said memory cell array, for selecting the columns;
a pair of data bus lines operatively connected to said gate means and each having a potential;
sense means, operatively connected to said pair of data bus lines, for sensing the one of the pair of data bus lines which has the highest potential and generating a charge signal on an output terminal in dependence thereon; and
charging means, operatively connected to said pair of data bus lines and the output terminal of said sense means, for charging the one of the pair of data bus lines in dependence upon the charge signal.

8. A memory circuit according to claim 7, wherein said charging means comprises:
a first transistor operatively connected to one of the pair of said data bus lines, said sense means and a voltage source; and
a second transistor operatively connected to the other one of said pair of data bus lines, said sense means and the voltage source.

* * * * *